(12) United States Patent
Yu

(10) Patent No.: US 10,444,621 B2
(45) Date of Patent: \*Oct. 15, 2019

(54) METHODS OF FORMING PATTERNS USING PHOTOMASK INCLUDING LIGHT-SHIELDING PORTION HAVING A RECESSED PORTION

(71) Applicant: Samsung Display Co., Ltd., Yongin-si, Gyeonggi-do (KR)

(72) Inventor: Man-Jong Yu, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/970,672

(22) Filed: May 3, 2018

(65) Prior Publication Data

US 2018/0252997 A1 Sep. 6, 2018

Related U.S. Application Data

(60) Continuation of application No. 15/709,344, filed on Sep. 19, 2017, now abandoned, which is a division of application No. 14/802,815, filed on Jul. 17, 2015, now Pat. No. 9,798,227.

(30) Foreign Application Priority Data

Feb. 5, 2015 (KR) .......................... 10-2015-0017905

(51) Int. Cl.
*H01L 21/308* (2006.01)
*G03F 1/38* (2012.01)
*H01L 21/3213* (2006.01)
*H01L 21/027* (2006.01)
*G03F 1/70* (2012.01)
(Continued)

(52) U.S. Cl.
CPC .................. *G03F 1/38* (2013.01); *G03F 1/70* (2013.01); *H01L 21/0274* (2013.01); *H01L 21/32139* (2013.01); *H01L 21/76838* (2013.01); *H01L 27/1288* (2013.01)

(58) Field of Classification Search
CPC . H01L 21/308; H01L 21/3085; H01L 21/768; H01L 21/76805; H01L 21/32139; H01L 21/0274; H01L 21/3213
See application file for complete search history.

(56) References Cited

U.S. PATENT DOCUMENTS 9,798,227 B2 \* 10/2017 Yu ..................... H01L 21/32139
2003/0190556 A1 10/2003 Nakashima
2005/0157237 A1 7/2005 Doi
(Continued)

FOREIGN PATENT DOCUMENTS

KR 10-2002-0080326 10/2002
KR 10-2005-0024668 3/2005
(Continued)

*Primary Examiner* — Selim U Ahmed
(74) *Attorney, Agent, or Firm* — Lewis Roca Rothgerber Christie LLP

(57) ABSTRACT

A photomask layout includes: a substrate region; a lower stepped region at a region of the substrate region; and a pattern region at least partially crossing the lower stepped region and including at least one notch portion at an area overlapping the lower stepped region. A method of forming a pattern is also provided.

3 Claims, 11 Drawing Sheets

(51) Int. Cl.
*H01L 21/768* (2006.01)
*H01L 27/12* (2006.01)

(56) References Cited

U.S. PATENT DOCUMENTS

2008/0003728 A1 1/2008 Hwang
2013/0037888 A1 2/2013 Han

FOREIGN PATENT DOCUMENTS

| KR | 10-2005-0069569 | 7/2005 |
| KR | 10-0608374 | 7/2006 |
| KR | 10-0674935 | 7/2006 |
| KR | 10-0728966 | 6/2007 |

* cited by examiner

METHODS OF FORMING PATTERNS USING PHOTOMASK INCLUDING LIGHT-SHIELDING PORTION HAVING A RECESSED PORTION

CROSS-REFERENCE TO RELATED APPLICATIONS

This application is a continuation of U.S. patent application Ser. No. 15/709,344, filed Sep. 19, 2017, which is a divisional of U.S. patent application Ser. No. 14/802,815, filed Jul. 17, 2015, now U.S. Pat. No. 9,798,227 issued Oct. 24, 2017, which claims priority to Korean Patent Application No. 10-2015-0017905, filed on Feb. 5, 2015 in the Korean Intellectual Property Office (KIPO), the entire content of all of which are incorporated herein by reference.

BACKGROUND

1. Field

Embodiments of the present invention relate to photomask layouts and methods of forming patterns using the same. More particularly, embodiments of the present invention relate to photomask layouts for a circuit formation and methods of forming patterns using the same.

2. Description of the Related Art

A photolithography process may be implemented when, for example, forming a gate structure and a wiring of a semiconductor device, a circuit or a thin film transistor (TFT) of a display device such as an organic light emitting display (OLED) device and a liquid crystal display (LCD) device, etc.

In the photolithography process, a photomask layout in which a circuit pattern is designed may be prepared, and a photoresist layer may be patterned using the photomask layout. A conductive layer may be patterned using the resultant photoresist pattern to form the predetermined circuit pattern.

A precise and fine construction of the photomask layout may be required in order to obtain the circuit pattern having desired width and pitch.

SUMMARY

According to an aspect of embodiments of the present invention, a photomask layout has improved accuracy and/or precision.

According to another aspect of embodiments of the present invention, a method of forming a pattern using the photomask layout has improved accuracy and/or precision.

According to one or more embodiments of the present invention, a photomask layout includes: a substrate region; a lower stepped region at a region of the substrate region; and a pattern region at least partially crossing the lower stepped region and including at least one notch portion at an area overlapping the lower stepped region.

In one or more embodiments, the at least one notch portion may be positioned at a boundary area in which the pattern region overlaps the lower stepped region.

In one or more embodiments, the at least one notch portion may be positioned at an intersection region of the lower stepped region and the pattern region.

In one or more embodiments, the at least one notch portion may be positioned at at least one vertex of the intersection region.

In one or more embodiments, the pattern region may completely cross the lower stepped region, and the at least one notch portion may include four notch portions positioned at the intersection region.

In one or more embodiments, the pattern region may partially cross the lower stepped region, and the at least one notch portion may include two notch portions positioned at the intersection region.

In one or more embodiments, the pattern region may cross each of the lower stepped region and another lower stepped region, and the at least one notch portion may be a number of notch portions that is a multiple of four.

In one or more embodiments, the lower stepped region may correspond to an active pattern or a lower wiring on a display substrate. The pattern region may correspond to an upper wiring on the active pattern or the lower wiring.

According to one or more embodiments of the present invention, a method of forming a pattern includes: forming a lower stepped pattern on a substrate; forming an upper pattern layer on the substrate, the upper pattern layer covering the lower stepped pattern; forming a photoresist layer on the upper pattern layer; partially removing the photoresist layer using a photomask to form a photoresist pattern, the photomask including a light-shielding portion that at least partially crosses the lower stepped pattern and includes a recessed portion; and partially removing the upper pattern layer using the photoresist pattern to form an upper pattern.

In one or more embodiments, an inclined region may be defined by a sidewall of the lower stepped pattern, and the recessed portion may at least partially overlap the inclined region.

In one or more embodiments, the recessed portion of the light-shielding portion may be formed at an intersection region of the light-shielding portion and the lower stepped pattern.

In one or more embodiments, the recessed portion of the light-shielding portion may be formed at a vertex of the intersection region.

In one or more embodiments, the method further includes forming a lower insulation layer covering the lower stepped pattern on the substrate before forming the upper pattern layer.

In one or more embodiments, the lower insulation layer may be partially etched to form a contact hole through which the lower stepped pattern is exposed. The upper pattern may fill the contact hole.

In one or more embodiments, the lower stepped pattern may be formed of a conductive material or a semiconductor material, and the upper pattern layer may be formed of a conductive material.

In one or more embodiments, the substrate may serve as a display substrate of a display device. The lower stepped pattern may serve as an active pattern or a signal pad of the display device. The upper pattern may serve as an upper wiring formed on the lower stepped pattern.

In one or more embodiments, the upper pattern may include a contact portion electrically connected to the lower stepped pattern.

In one or more embodiments, the photoresist pattern and the upper pattern may have a uniform width.

BRIEF DESCRIPTION OF THE DRAWINGS

Aspects and features of the present invention will be more clearly understood from the following description of some example embodiments, taken in conjunction with the accompanying drawings.

FIG. 1 is a top plan view illustrating a photomask layout in accordance with one or more embodiments of the present invention;

FIGS. 2 and 3 are top plan views illustrating photomask layouts in accordance with one or more embodiments of the present invention;

FIGS. 4 to 10 are cross-sectional views and top plan views illustrating a method of forming a pattern in accordance with one or more embodiments of the present invention;

FIGS. 11 and 12 are a cross-sectional view and a top plan view, respectively, illustrating a method of forming a pattern in accordance with a comparative example; and FIGS. 13 to 19 are cross-sectional views and top plan views illustrating a method of forming a pattern in accordance with one or more embodiments of the present invention.

DETAILED DESCRIPTION

Figure 1:
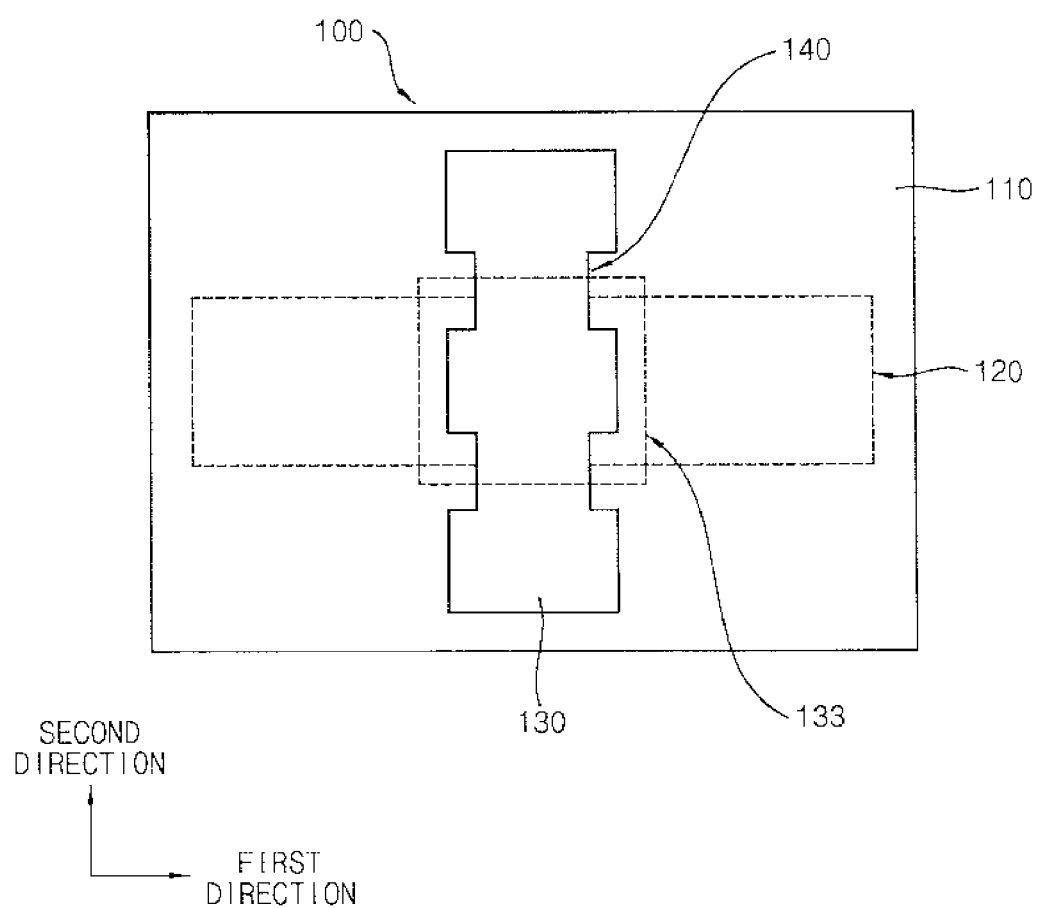
FIGS. 1 to 19 represent some non-limiting, example embodiments as described herein.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms "first," "second," "third," etc. may be used herein to describe various elements, these elements should not be limited by these terms. These terms are used to distinguish one element from another. Thus, a "first" element discussed below could be termed a "second" element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a top plan view illustrating a photomask layout in accordance with one or more embodiments of the present invention.

Referring to FIG. 1, a photomask layout 100 may include a substrate region 110, a lower stepped region 120, and a pattern region 130.

The substrate region 110 may correspond to, for example, a top surface of a substrate in a display device, such as an OLED device or an LCD device, for example.

Two directions substantially parallel to the top surface of the substrate and crossing each other are defined as a first direction and a second direction. For example, the first and second directions may be perpendicular to each other. A direction indicated by an arrow and a reverse direction thereof are considered as the same direction. The definition of the directions may be applied throughout all of the drawings.

The lower stepped region 120 indicated by a dashed line may correspond to a predetermined lower pattern formed on the top surface of the substrate. In one or more embodiments, the predetermined lower pattern may include an active pattern formed of a semiconductor material, or a lower conductive pattern.

The lower stepped region 120 is illustrated as a rectangular shape in FIG. 1. However, the shape of the lower stepped region 120 may be properly adjusted according to a construction of the predetermined lower pattern.

The pattern region 130 may correspond to a pattern transferred from a photolithography process using the photomask layout 100. In one or more embodiments, the pattern formed from the pattern region 130 may include a circuit pattern such as source and drain wirings included in the display device.

In one or more embodiments, the pattern region 130 may cross the lower stepped region 120. For example, the pattern region 130 and the lower stepped region 120 may extend in the second direction and the first direction, respectively.

The pattern region 130 may include at least one notch portion 140. The notch portion 140 may have a recess shape or a substantial recess shape formed at the pattern region 130.

In one or more embodiments, the notch portion 140 may at least partially overlap the lower stepped region 120. In one or more embodiments, the notch portion 140 may partially overlap the lower stepped region 120, and a remaining area of the notch portion 140 may overlap the substrate region 110.

The notch portion 140 may be formed at each boundary area in which the pattern region 130 and the lower stepped region 120 may cross each other. As illustrated in FIG. 1, an intersection region 133 may be defined by the pattern region 130 and the lower stepped region 120 as indicated by a dashed quadrangle. Four notch portions 140 may be formed at the intersection region 133. For example, the notch portion 140 may be formed at a vertex of the intersection region 133.

Figure 2:
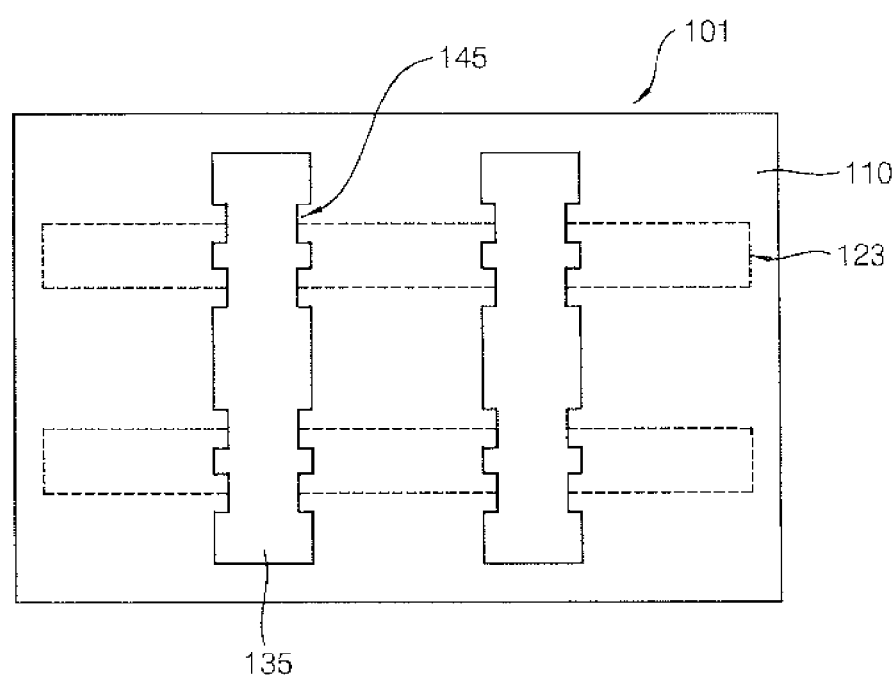
Figure 2:
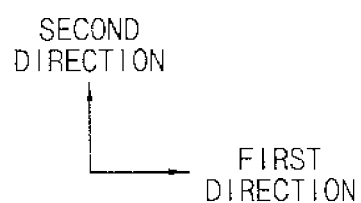
Figure 3:
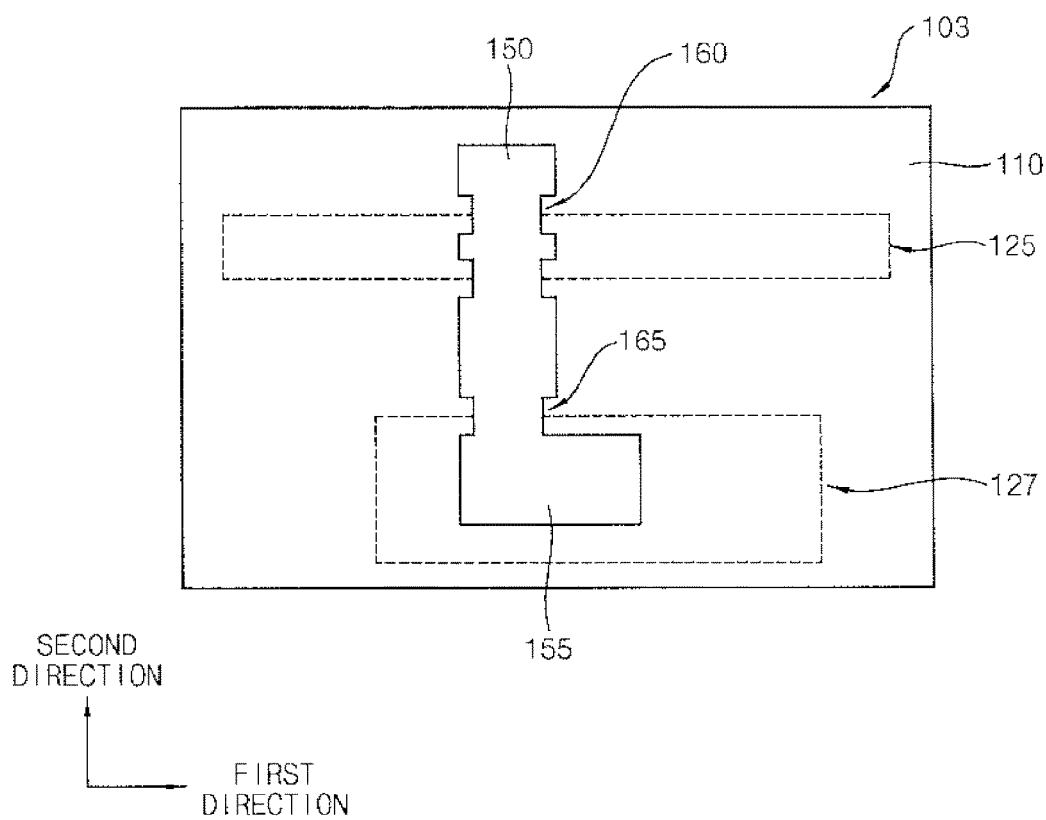

FIGS. 2 and 3 are top plan views illustrating photomask layouts in accordance with some example embodiments.

Referring to FIG. 2, a photomask layout 101 may include a plurality of lower stepped regions 123 and a plurality of pattern regions 135.

The plurality of the lower stepped regions 123 extending in the first direction may be arranged along the second direction. The plurality of the pattern regions 135 extending in the second direction may be arranged along the first direction.

The pattern region 135 may be superimposed over the plurality of the lower stepped regions 123. Accordingly, a plurality of intersection regions may be defined from one of the pattern regions 135. As described above, a notch portion 145 may be formed at a boundary area in which the pattern region 135 and the lower stepped region 123 cross each other. Thus, in an implementation of FIG. 2, the number of the notch portions 145 included in the one of the pattern regions 135 may be a multiple of four, e.g., eight of the notch portions 145, as illustrated in FIG. 2.

In one or more embodiments, the lower stepped region 123 may correspond to a lower wiring extending on a top surface of a substrate. The pattern region 135 may correspond to an upper wiring extending and being superimposed on the lower wiring.

Referring to FIG. 3, a photomask layout 103 may include a first lower stepped region 125 and a second lower stepped region 127. The first and second lower stepped regions 125 and 127 may have shapes and/or dimensions different from each other.

A pattern region 150 may extend in, for example, the second direction, and may overlap the first and second lower stepped regions 125 and 127. In one or more embodiments, the pattern region 150 may cross the first lower stepped region 125, and may partially overlap the second lower stepped region 127.

As illustrated with reference to FIGS. 1 and 2, the pattern region 150 may include notch portions at boundary areas overlapping the lower stepped regions 125 and 127.

As illustrated in FIG. 3, for example, four of first notch portions 160 may be formed at an intersection region of the pattern region 150 and the first lower stepped region 125. Two of second notch portions 165 may be formed at an intersection region of the pattern region 150 and the second lower stepped region 127.

In one or more embodiments, the pattern region 150 may include a contact region 155 defined by a portion of the pattern region 150 overlapping the second lower stepped region 127. For example, the contact region 155 may be transferred into a contact that may be in contact with a lower pattern formed in the second lower stepped region 127.

In one or more embodiments, for example, a lower wiring of a display device may be formed in the first lower stepped region 125. An active pattern including a semiconductor material such as amorphous silicon or an oxide semiconductor may be formed in the second lower stepped region 127.

According to example embodiments as described above, the photomask layout may include the notch portion in the pattern region. The notch portion may be formed at a boundary area with the lower stepped region generating a stepped portion on a substrate. Thus, a spreading of a photoresist material and a width increase of a target pattern due to a diffused reflection while performing an exposure process, which may be caused by the stepped portion, may be prevented or substantially prevented.

Figure 4:
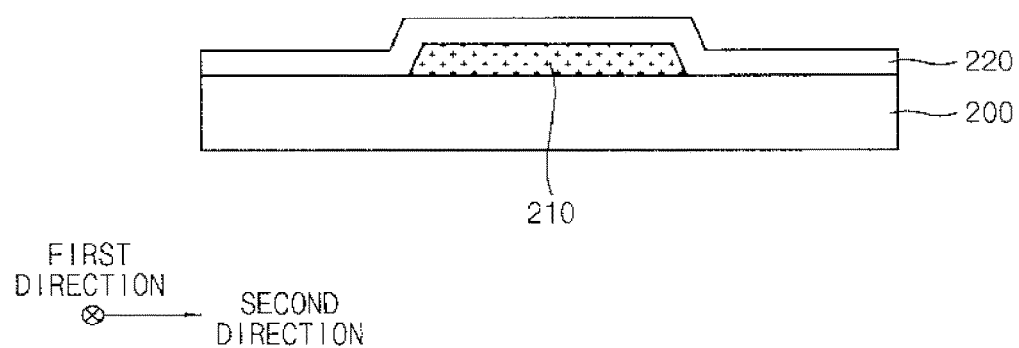
Figure 5:
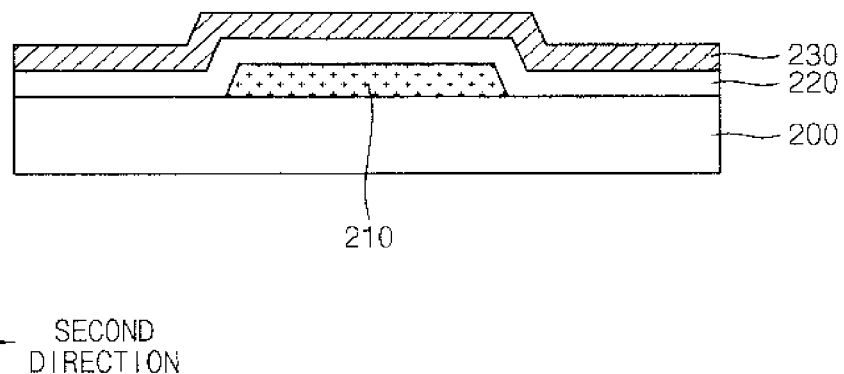
Figure 6:
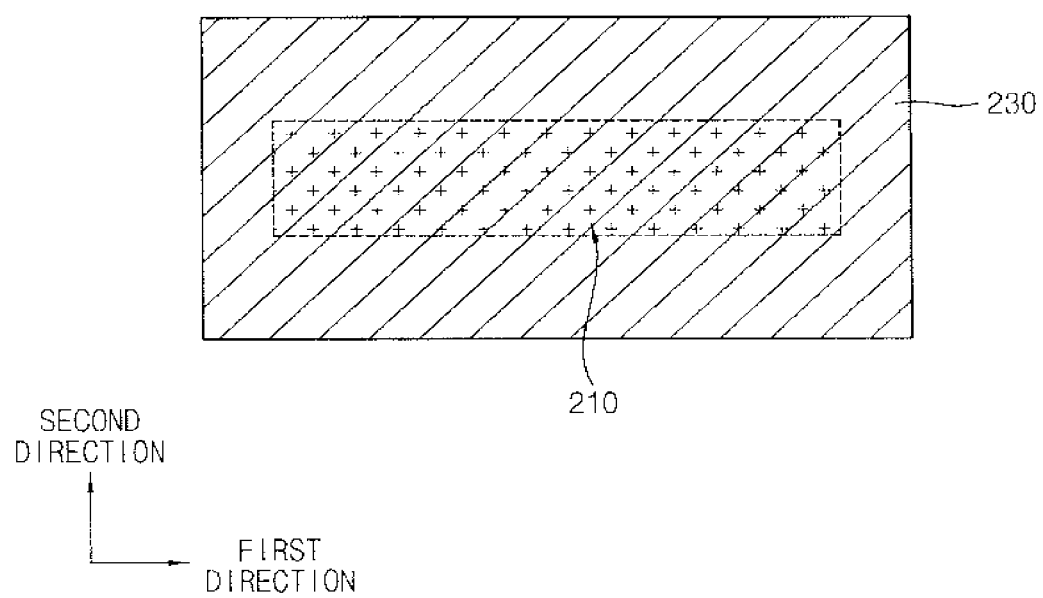
Figure 7:
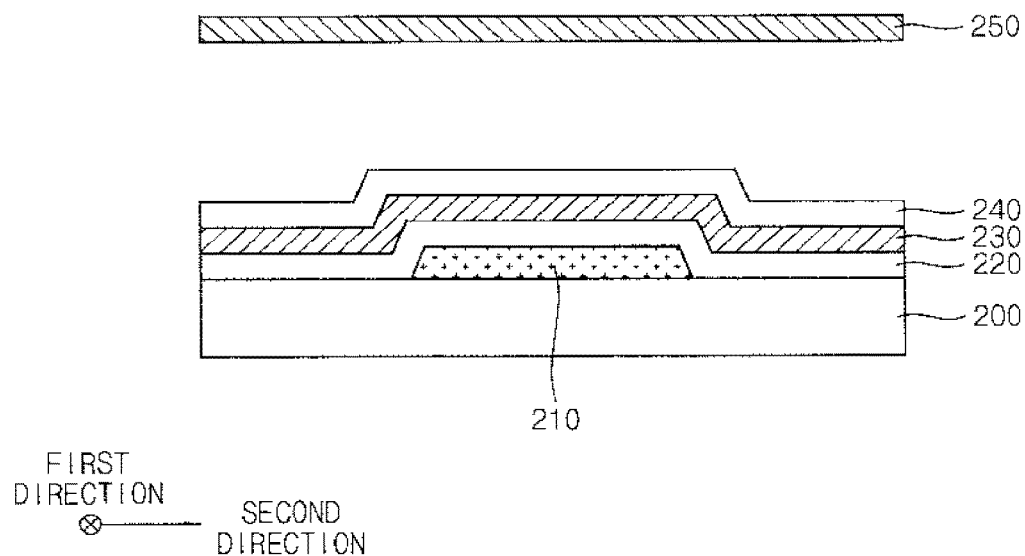
Figure 8:
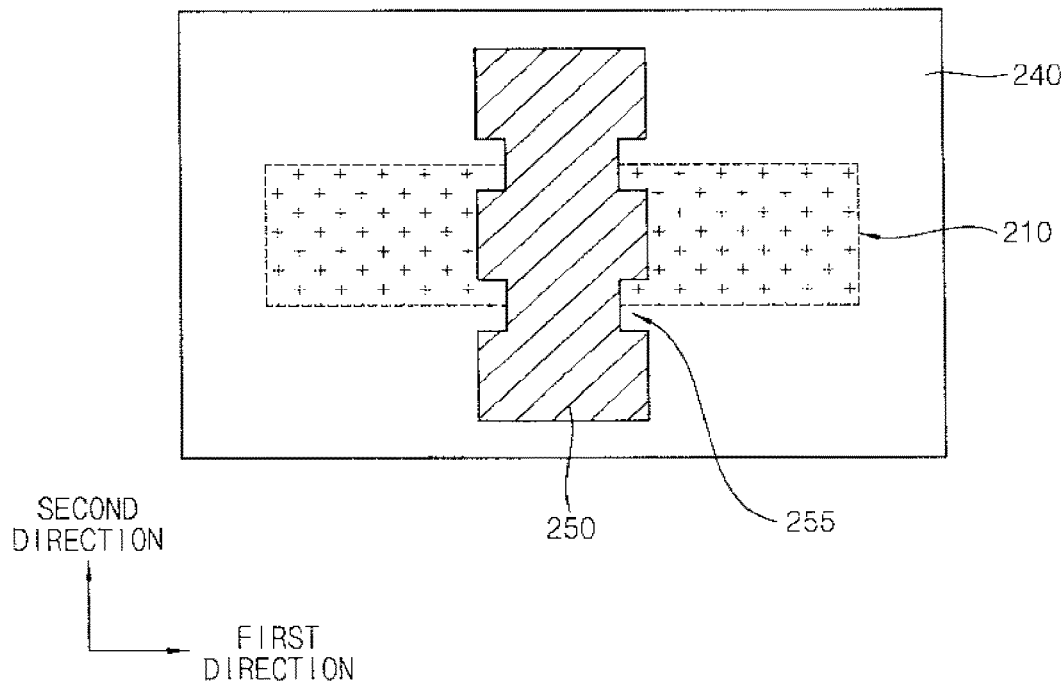
Figure 9:
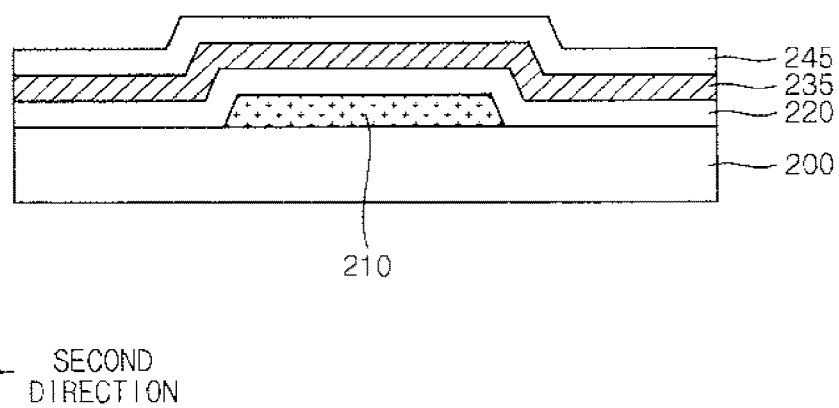
Figure 10:
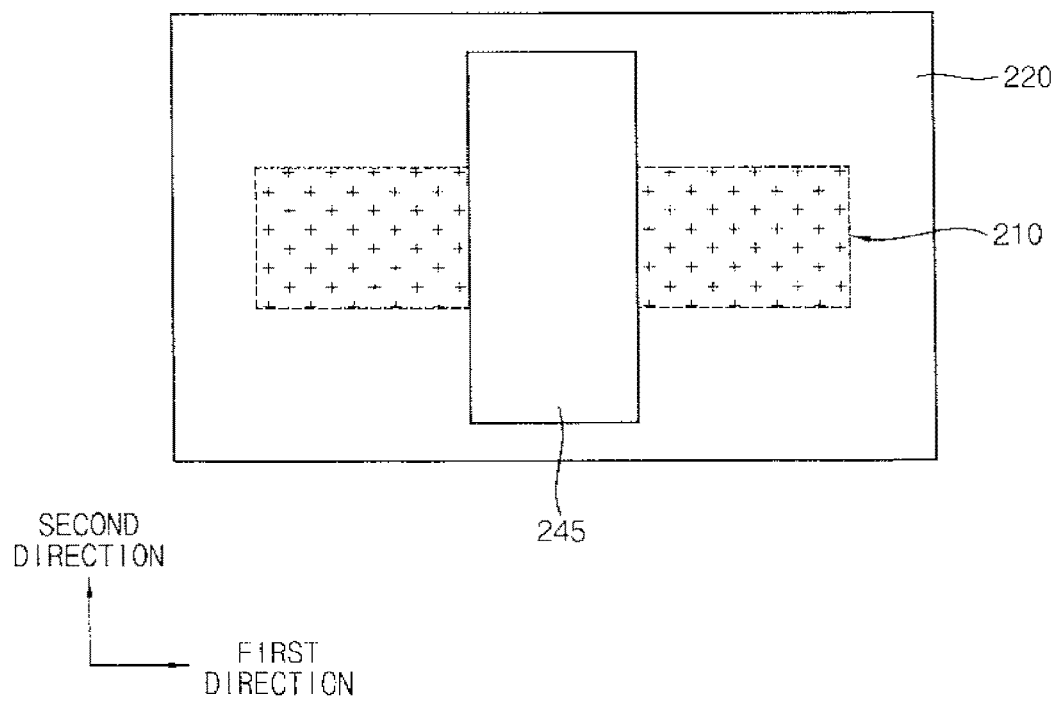

FIGS. 4 to 10 are cross-sectional views and top plan views illustrating a method of forming a pattern in accordance with one or more example embodiments. Specifically, FIGS. 4, 5, 7, and 9 are cross-sectional views illustrating the method. FIGS. 6, 8, and 10 are top plan views illustrating the method.

For example, FIGS. 4 to 10 illustrate a method of forming a pattern utilizing the photomask layout illustrated with reference to FIG. 1, 2, or 3.

Referring to FIG. 4, a lower stepped pattern 210 and a lower insulation layer 220 may be formed on a substrate 200.

The substrate 200 may be provided as a base substrate or a back-plane (BP) substrate of a display device, such as an OLED device or an LCD device. In one or more embodiments, a transparent insulation substrate may be used as the substrate 200. For example, the substrate 200 may include a glass substrate, a transparent plastic substrate including, e.g., polyimide, polyethylene terephthalate (PET), or polyethylene naphthalate (PEN), or a transparent metal oxide substrate.

In one or more example embodiments, a lower pattern layer may be formed on the substrate 200, and the lower pattern layer may be partially etched by a first photo process to form the lower stepped pattern 210. A photomask layout used in the first photo process may include a pattern region corresponding to the lower stepped region illustrated in FIG. 1, 2, or 3.

In one or more example embodiments, the lower pattern layer may be formed of a conductive material including a metal such as tungsten, copper, aluminum, etc., or a metal nitride. In this case, the lower stepped pattern 210 may serve as a lower wiring of the display device.

In one or more embodiments, the lower pattern layer may be formed of a silicon compound such as amorphous silicon, or an oxide semiconductor such as indium gallium zinc oxide (IGZO), indium tin zinc oxide (ITZO), etc. In this case, the lower stepped pattern 210 may serve as an active pattern of the display device.

The lower pattern layer may be formed by a chemical vapor deposition (CVD) process, a plasma enhanced chemical vapor deposition (PECVD) process, a high density plasma-chemical vapor deposition (HDP-CVD) process, a thermal evaporation process, a sputtering process, an atomic layer deposition (ALD) process, or the like.

For example, the lower stepped pattern 210 may extend in the first direction. In one or more embodiments, a barrier layer covering a top surface of the substrate 200 may be formed before the formation of the lower stepped pattern 210. The barrier layer may be formed of silicon oxide, silicon nitride, and/or silicon oxynitride.

The lower insulation layer 220 may be formed on the top surface of the substrate 200 to cover the lower stepped pattern 210. The lower insulation layer 220 may be formed conformally according to a profile of the lower stepped pattern 210. Thus, the lower insulation layer 220 may include a protrusion or a stepped portion at a portion overlapping the lower stepped pattern 210.

The lower insulation layer 220 may be formed of, for example, silicon oxide, silicon nitride, and/or silicon oxynitride by a CVD process, a thermal deposition process, an ALD process, or the like.

Referring to FIGS. 5 and 6, an upper pattern layer 230 may be formed on the lower insulation layer 220. As illustrated in FIG. 6, the upper pattern layer 230 may fully cover the lower stepped pattern 210.

In one or more example embodiments, the upper pattern layer 230 may be formed of a metal such as tungsten, copper, aluminum, titanium, or tantalum, or a nitride of the metal. In one or more embodiments, the upper pattern layer 230 may be formed by a CVD process, a sputtering process, or an ALD process.

Referring to FIGS. 7 and 8, a photoresist layer 240 may be formed on the upper pattern layer 230. For convenience of description, the lower stepped pattern 210 is illustrated to be projected under the photoresist layer 240.

In one or more embodiments, the photoresist layer 240 may include a positive photosensitive material, a polymer structure of which may be damaged by an exposure to light to be removed by a developing process. The photoresist layer 240 may be formed by coating a photoresist composition through a spin coating process or a slit coating process on the upper pattern layer 230.

A photomask for a second photo process may be placed over the photoresist layer 240. The photomask may include a light-shielding portion 250 crossing the lower stepped pattern 210. A remaining portion of the photomask except for the light-shielding portion 250 may be defined as a transmitting portion.

In one or more example embodiments, the photomask for the second photo process may be prepared from the photomask layout illustrated with reference to FIG. 1. Accordingly, the light-shielding portion 250 may be formed substantially from the pattern region 130 of the photomask layout, and the light-shielding portion 250 may include a recessed portion 255 corresponding to the notch portion 140 of the photomask layout.

As illustrated in FIG. 8, the recessed portion 255 of the light-shielding portion 250 may be formed at a boundary area in which the light-shielding portion 250 and the lower stepped pattern 210 overlap and cross each other. For example, an intersection region having a quadrangle shape may be defined by the light-shielding portion 250 and the lower stepped pattern 210, and the recessed portion 255 may be formed at each vertex of the intersection region. In one or more embodiments, the recessed portion 255 may partially overlap the lower stepped pattern 210.

In one or more embodiments, a plurality of the lower stepped patterns 210 may be formed along the second direction, and a plurality of the light-shielding portions 250, each of which may extend in the second direction may be arranged along the first direction. In one or more embodiments, the plurality of the lower stepped patterns 210 may be formed at locations of the lower stepped regions 123 of the photomask layout illustrated in FIG. 2, the light-shielding portions 250 may be formed at locations of the pattern regions 135, and the recessed portions 255 may be formed at locations of the notch portions 145.

Thus, a plurality of the intersection regions may be defined by one of the light-shielding portions 250, and the recessed portions 255 of a multiple of four may be included in the one of the light-shielding portions 250.

Referring to FIGS. 9 and 10, the second photo process may be performed utilizing the photomask.

For example, exposure and developing processes may be performed such that an exposed portion of the photoresist layer 240 may be removed. Accordingly, a portion of the photoresist layer 240 under the light-shielding portion 250 may remain to form a photoresist pattern 245. The upper pattern layer 230 may be partially removed using the photoresist pattern 245 as an etching mask. Thus, an upper pattern 235 extending in the second direction and crossing the lower stepped pattern 210 may be formed under the photoresist pattern 245. For convenience of description, the lower stepped pattern 210 is illustrated to be projected under the lower insulation layer 220 in FIG. 10.

The upper pattern 235 may have a substantially uniform width in the first direction. While performing the second photo process, a diffused reflection and/or a spreading of the photosensitive material may occur at a portion of the photoresist layer 240 overlapping the recessed portion 255 due to a stepped portion generated from the lower stepped pattern 210. However, according to example embodiments, the notch portion and the recessed portion 255 may be formed in the photomask layout and the photomask, respectively, in advance. Therefore, an expansion of the photoresist pattern 245 caused by the diffused reflection and the spreading of the photosensitive material may be suppressed so that the upper pattern 235 having a uniform line and space (LS) may be obtained.

After the second photo process, the photoresist pattern 245 may be removed by an ashing process and/or a strip process.

In one or more embodiments, the upper pattern 235 may serve as an upper wiring, such as a data line, a source line, a drain line, etc. In one or more embodiments, the lower stepped pattern 210 may serve as a lower wiring, such as a scan line.

In one or more embodiments, the upper pattern 235 may serve as a gate electrode included in a switching device or a thin film transistor (TFT) of the display device. In this case, the lower stepped pattern 210 may serve as an active pattern of the display device, and the lower insulation layer 220 may serve as a gate insulation layer.

Figure 11:
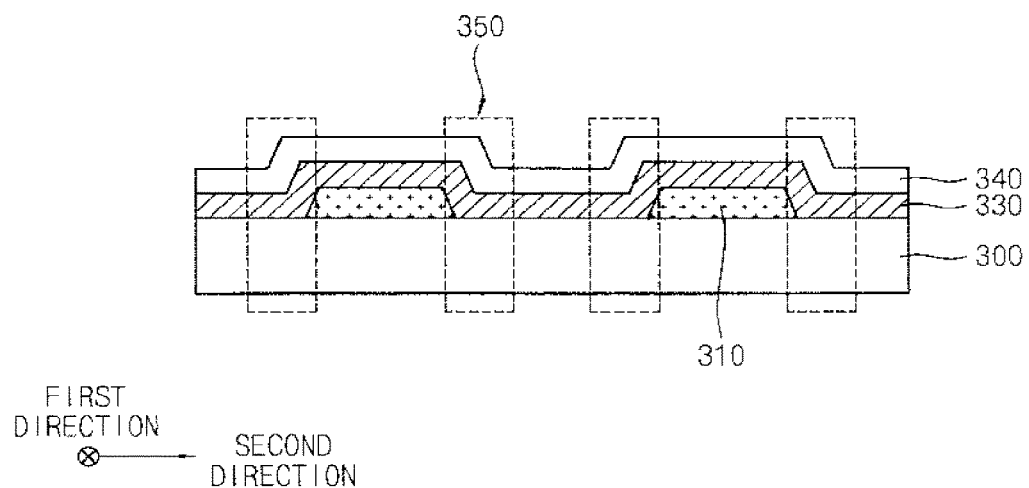
Figure 12:
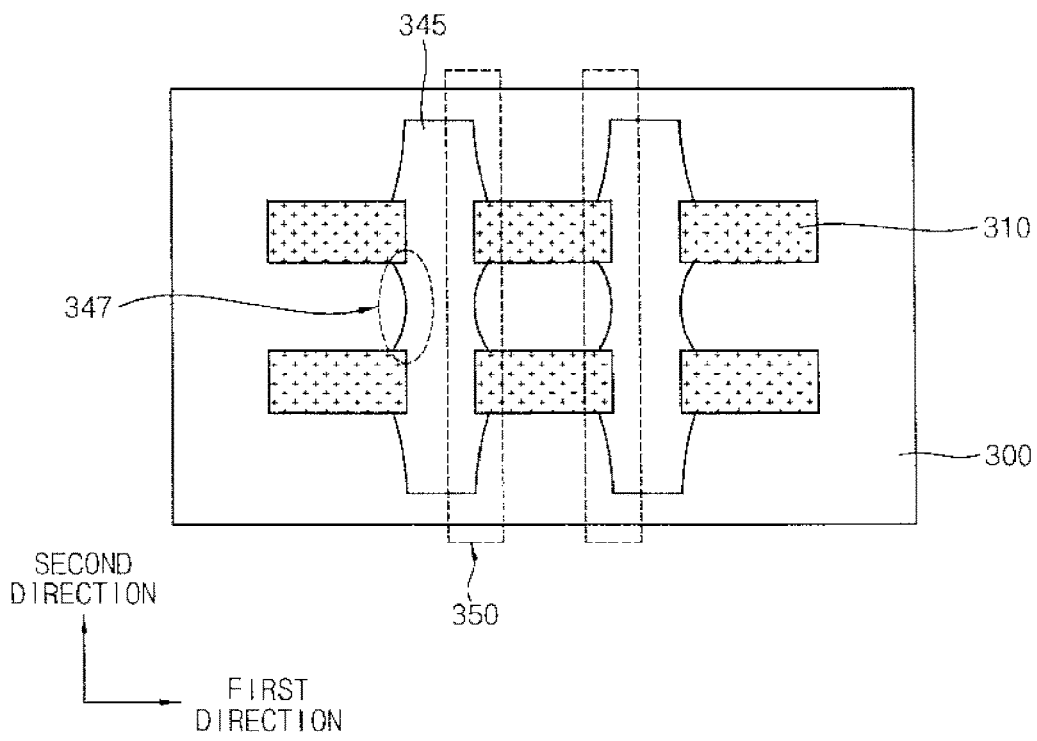

FIGS. 11 and 12 are a cross-sectional view and a top plan view, respectively, illustrating a method of forming a pattern in accordance with a comparative example.

Referring to FIG. 11, lower stepped patterns 310 extending in the first direction may be formed on a substrate 300, and an upper pattern layer 330 and a photoresist layer 340 covering the lower stepped patterns 310 may be formed on the substrate 300. As illustrated in FIG. 4, a lower insulation layer (not illustrated) may be further formed before the formation of the upper pattern layer 330.

Referring to FIG. 12, the photoresist layer 340 may be patterned using a photomask layout or a photomask that may include a pattern region or a light-shielding portion linearly extending in the second direction.

As illustrated in FIGS. 11 and 12, an inclined region 350 indicated by a dashed quadrangle may be defined by portions of the upper pattern layer 330 and the photoresist layer 340 adjacent to a sidewall of the lower stepped pattern 310. A height difference of the photoresist layer 340 may be generated by the inclined region 350, and thus a diffused reflection may be caused during an exposure process. Further, a spreading or a local concentration of a photosensitive material may be caused by the height difference.

As a result, a photoresist pattern 345 formed from exposure and developing processes may include a photoresist tail 347 expanded in, for example, the first direction between the adjacent lower stepped patterns 310.

When the upper pattern layer 330 is etched using the photoresist pattern 345 formed by the comparative example, an upper pattern formed from the upper pattern layer 330 may have an irregular width. Additionally, the adjacent upper patterns may not be completely separated, and/or a short circuit may be caused therebetween.

However, according to example embodiments of the present invention as described above, a notch portion or a recessed portion may be formed in a pattern region of a photomask layout or a light-shielding portion of a photomask overlapping the inclined region 350 in consideration of the photoresist tail. Therefore, an upper pattern having a uniform width may be obtained, and a short circuit between the upper patterns due to the photoresist tail may be avoided.

Figure 15:
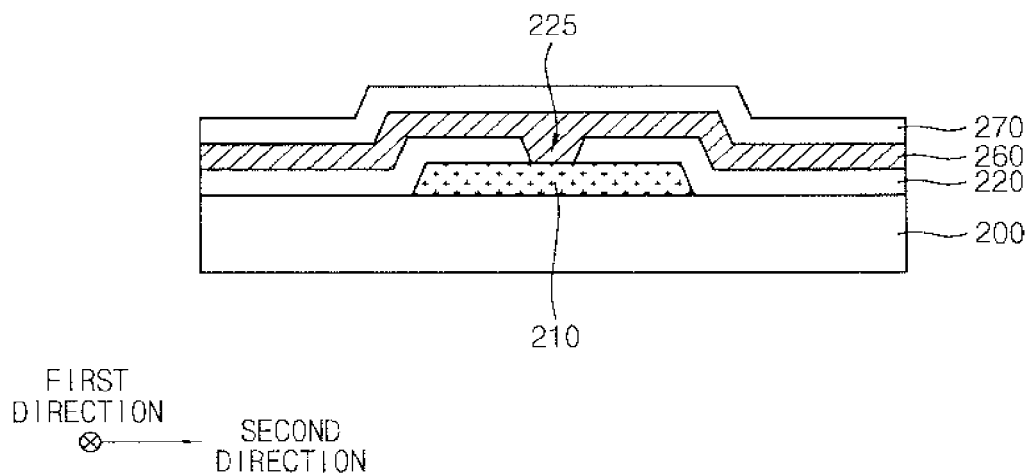
Figure 16:
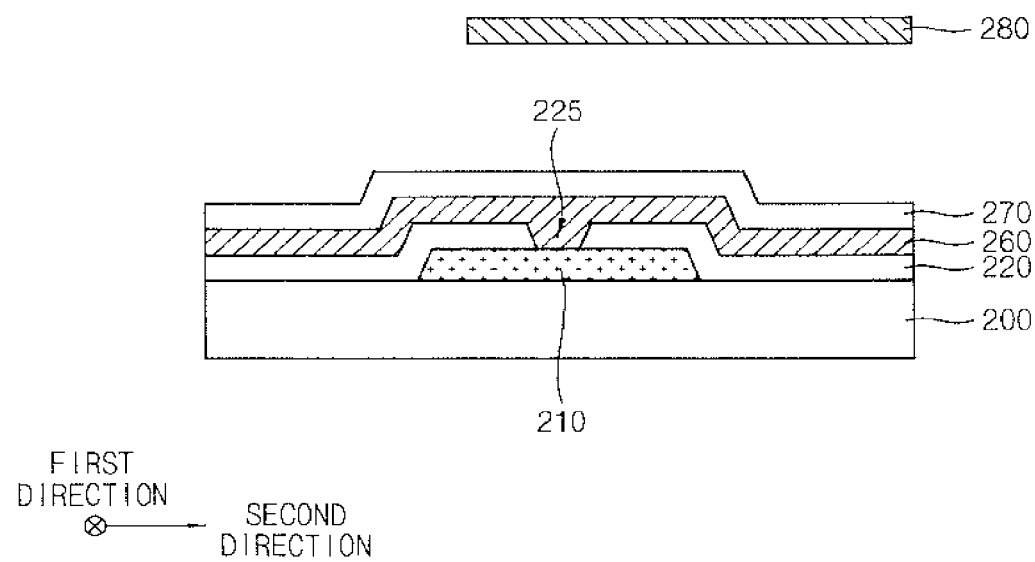
Figure 17:
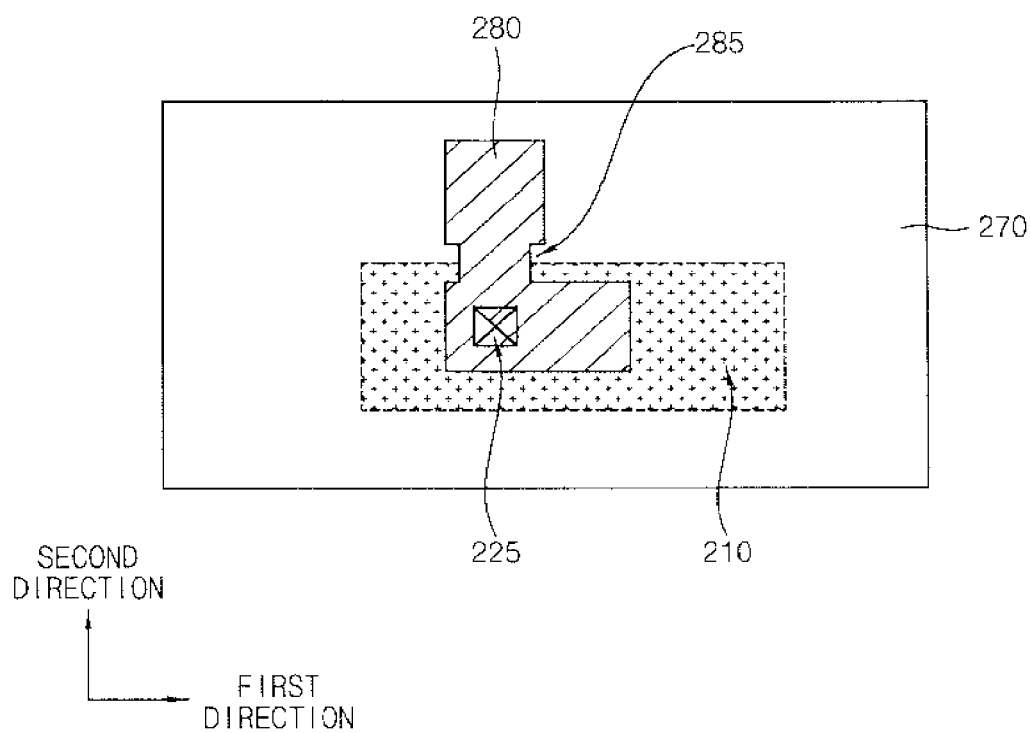
Figure 18:
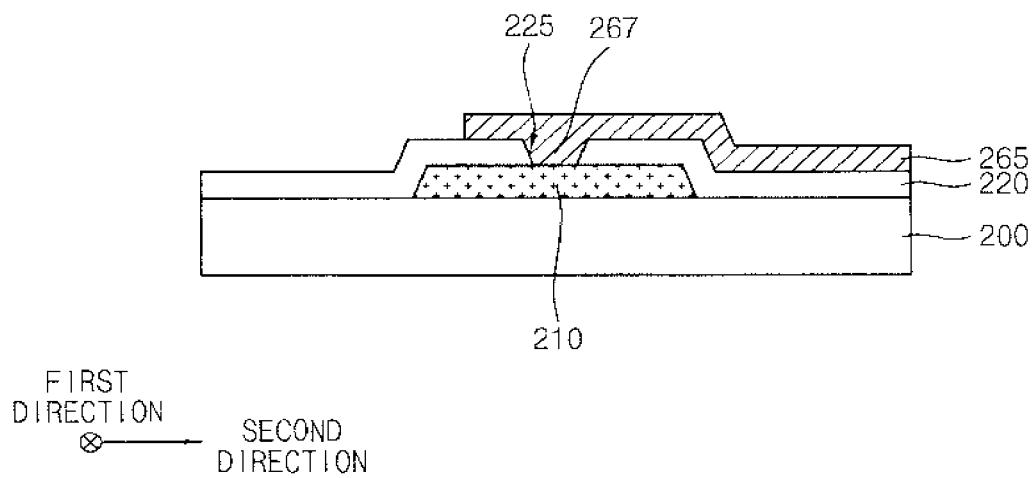
Figure 19:
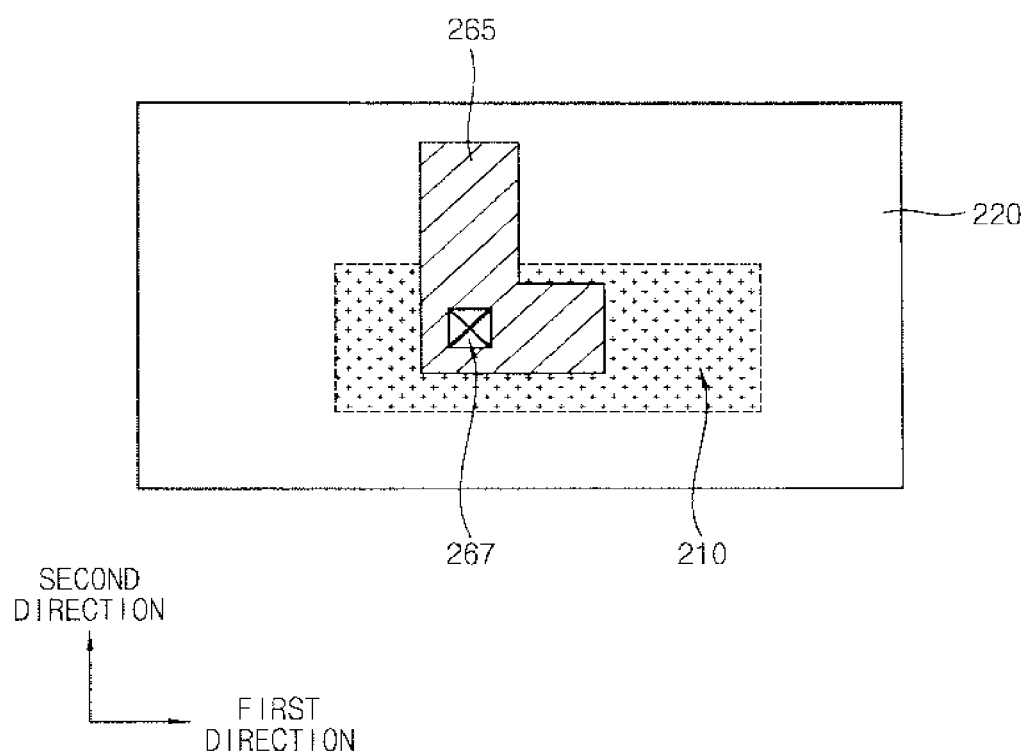

FIGS. 13 to 19 are cross-sectional views and top plan views illustrating a method of forming a pattern in accordance with one or more example embodiments. Specifically, FIGS. 13 to 16, and FIG. 18 are cross-sectional views illustrating the method of forming the pattern. FIGS. 17 and 19 are top plan views illustrating the method of forming the pattern.

For example, FIGS. 13 to 19 illustrate a method of forming a circuit pattern or a wiring pattern utilizing the photomask layout illustrated with reference to FIG. 1, 2, or 3. Detailed description of processes and/or materials substantially the same as or similar to those illustrated with reference to FIGS. 4 to 10 are omitted herein.

Figure 13:
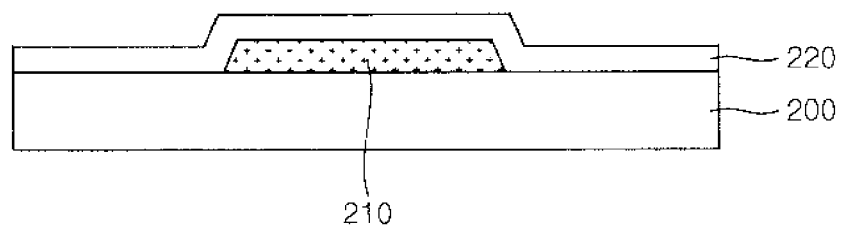

Referring to FIG. 13, a process substantially the same as or similar to that illustrated with reference to FIG. 4 may be performed.

Accordingly, the lower stepped pattern 210 may be formed on a substrate 200, and the lower insulation layer 220 covering the lower stepped pattern 210 may be formed.

Figure 14:
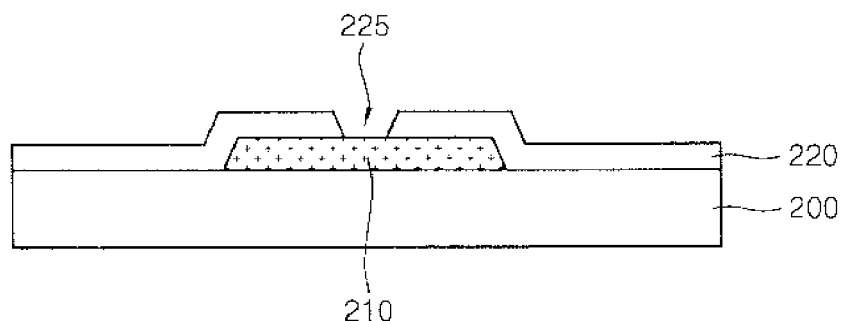

Referring to FIG. 14, the lower insulation layer 220 may be partially etched to form a contact hole 225 through which a top surface of the lower stepped pattern 210 may be partially exposed.

Referring to FIG. 15, a process substantially the same as or similar to that illustrated with reference to FIGS. 5 and 6 may be performed. For example, an upper pattern layer 260 sufficiently filling the contact hole 225 may be formed on the lower insulation layer 220, and a photoresist layer 270 may be formed on the upper pattern layer 260. The upper pattern layer 260 may be in contact with the top surface of the lower stepped pattern 210 exposed through the contact hole 225.

Referring to FIGS. 16 and 17, a photomask including a light-shielding portion 280 may be placed over the photoresist layer 270. For convenience of description, the lower stepped pattern 210 is illustrated to be projected under the photoresist layer 270.

The photomask may be prepared from the photomask layout illustrated with reference to FIG. 3. In this case, the lower stepped pattern 210 may be formed on a portion of the substrate 200 corresponding to the second lower stepped region 127 illustrated in FIG. 3.

The light-shielding portion 280 may partially overlap the lower stepped pattern 210, and may extend in the second direction. The light-shielding portion 280 may include a recessed portion 285 formed at a boundary area in which the light-shielding portion 280 and the lower stepped pattern 210 cross each other. The recessed portion 285 may correspond to the second notch portion 165 of FIG. 3.

Referring to FIGS. 18 and 19, processes substantially the same as or similar to those illustrated with reference to FIGS. 9 and 10 may be performed.

Accordingly, a photo process may be performed using the photomask that may include the light-shielding portion 280 such that the photoresist layer 270 may be partially removed to form a photoresist pattern. The upper pattern layer 260 may be patterned using the photoresist pattern as an etching mask. Thus, an upper pattern 265 extending in the second direction, and crossing and overlapping the lower stepped pattern 210 may be formed.

The upper pattern 265 may be formed in the contact hole 225, and may include a contact portion 267 which makes contact with the lower stepped pattern 210.

The photoresist pattern may be removed by an ashing process and/or a strip process after the formation of the upper pattern 265.

As described above, the light-shielding portion 280 may be formed from a photomask layout including a notch portion to include the recessed portion 285 at a portion adjacent to an inclined region created by the lower stepped pattern 210. Therefore, a photoresist tail caused by the inclined region may be prevented or substantially prevented, and the upper pattern 265 obtained by the photo process may have a uniform width.

In one or more embodiments, the lower stepped pattern 210 may serve as an active pattern of a display device. In this case, the upper pattern 265 may serve as a source wiring or a drain wiring, and the contact portion 267 may serve as a source contact or a drain contact.

In one or more embodiments, the lower stepped pattern 210 may serve as a conductive pad, such as a data pad or a signal pad. In this case, the upper pattern 265 may serve as an upper wiring electrically connected to the conductive pad.

According to example embodiments of the present inventive concepts, a photomask layout may include a pattern region in which a notch portion may be formed at a boundary area crossing a lower stepped region. Accordingly, an irregular pattern formation caused by a diffused reflection or a photoresist tail may be prevented or substantially prevented. The photomask layout and methods of forming patterns may be implemented for formations of various structures included in a display device or a semiconductor device.

The foregoing is illustrative of some example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the spirit and scope of the present inventive concept as defined in the claims and equivalents thereof. Therefore, it is to be understood that the foregoing is illustrative of various example embodiments and is not to be construed as limited to the specific example embodiments disclosed, and that modifications to the disclosed example embodiments, as well as other example embodiments, are intended to be included within the spirit and scope of the appended claims and equivalents thereof.

What is claimed is:

1. A method of forming a pattern, the method comprising:
    forming a first pattern on a substrate such that a sidewall of the first pattern extends in a lengthwise direction of the first pattern;
    forming a second pattern layer on the substrate, the second pattern layer covering the first pattern;
    forming a photoresist layer on the second pattern layer;
    partially removing the photoresist layer using a photomask to form a photoresist pattern, the photomask including a light-shielding portion that at least partially crosses the first pattern and includes a recessed portion that is recessed toward the lengthwise direction of the first pattern; and
    partially removing the second pattern layer using the photoresist pattern to form a second pattern,
    wherein an inclined region is defined by the sidewall of the first pattern, and the recessed portion at least partially overlaps a portion under which the inclined region is located.

2. A method of forming a pattern, the method comprising:
forming a first pattern on a substrate such that a sidewall of the first pattern extends in a lengthwise direction of the first pattern;
forming a second pattern layer on the substrate, the second pattern layer covering the first pattern;
forming a photoresist layer on the second pattern layer;
partially removing the photoresist layer using a photomask to form a photoresist pattern, the photomask including a light-shielding portion that at least partially crosses the first pattern and includes a recessed portion that is recessed toward the lengthwise direction of the first pattern; and
partially removing the second pattern layer using the photoresist pattern to form a second pattern,
wherein the recessed portion of the light-shielding portion is formed to overlap an intersection region of the light-shielding portion and the first pattern.

3. The method of claim 2, wherein the recessed portion of the light-shielding portion is formed to overlap a vertex of the intersection region.

\* \* \* \* \*